(12) United States Patent
Myong et al.

(10) Patent No.: US 7,939,444 B2
(45) Date of Patent: May 10, 2011

(54) MANUFACTURING METHODS OF THIN FILM SOLAR CELL AND THIN FILM SOLAR CELL MODULE

(75) Inventors: Seung-Yeop Myong, Seoul (KR); Boung-Kwon Lim, Chungcheongbuk-do (KR)

(73) Assignee: Kisco (KR)

( * ) Notice: Subject to any disclaimer, the term of this patent is extended or adjusted under 35 U.S.C. 154(b) by 211 days.

(21) Appl. No.: 12/472,217

(22) Filed: May 26, 2009

(65) Prior Publication Data

US 2010/0304524 A1    Dec. 2, 2010

(51) Int. Cl.
  *H01L 21/44* (2006.01)
(52) U.S. Cl. .................. 438/609; 257/E23.064; 257/72
(58) Field of Classification Search ............... 438/73; 257/E21.226, 59, 72, E23.064, E31.126
See application file for complete search history.

(56) References Cited

U.S. PATENT DOCUMENTS

| | | | |
|---|---|---|---|
| 4,393,267 A | 7/1983 | Peterson | |
| 6,240,931 B1 | 6/2001 | Fujii et al. | |
| 6,566,159 B2 * | 5/2003 | Sawada et al. | 438/57 |
| 6,946,597 B2 * | 9/2005 | Sager et al. | 136/263 |
| 2002/0059726 A1 * | 5/2002 | Sawada et al. | 29/890.033 |
| 2002/0170586 A1 | 11/2002 | Lee et al. | |
| 2003/0037457 A1 | 2/2003 | Bailey et al. | |
| 2003/0168660 A1 | 9/2003 | Terakawa et al. | |
| 2005/0181534 A1 * | 8/2005 | Yoshimi et al. | 438/96 |
| 2006/0096622 A1 | 5/2006 | Lee et al. | |
| 2008/0092953 A1 * | 4/2008 | Lee | 136/261 |
| 2008/0223434 A1 | 9/2008 | Ikenoue et al. | |

FOREIGN PATENT DOCUMENTS

DE    19516446    11/1996

OTHER PUBLICATIONS

John R. Vig, "Journal of Vacuum Science and Technology: Part A," pp. 1027-1034 (1985).
Lynn Davis, "Properties of Transparent Conducting Oxides Desposited At Room Temperature," Thin Solid Films 236, pp. 1-5, (1993).
Hanabusa et al., "Pulsed Laser Deposition of Silicon Films for Solar Cell Applications," Nuclear Instruments and Methods in Physics Research B 121, pp. 367-370 (1997).

* cited by examiner

*Primary Examiner* — Thao P. Le
(74) *Attorney, Agent, or Firm* — The Belles Group, P.C.

(57) ABSTRACT

A manufacturing method of a thin film solar cell comprises performing dry cleaning of an insulation substrate on which a transparent electrode is formed, patterning the transparent electrodes to be spaced apart from each other, performing dry cleaning of the patterned transparent electrodes, forming a semiconductor layer on surfaces of the transparent electrodes and patterning a metal electrode on the semiconductor layer.

16 Claims, 5 Drawing Sheets

MANUFACTURING METHODS OF THIN FILM SOLAR CELL AND THIN FILM SOLAR CELL MODULE

BACKGROUND

1. Field

The present embodiment relates to a manufacturing method of a thin film solar cell and a thin film solar cell module.

2. Description of the Related Art

A solar cell is a semiconductor device converting solar energy into electrical energy. The solar cell may be classified into a silicon type, a chemical compound type, and an organic material type according to its material.

A silicon system solar cell is classified into a single crystalline silicon solar cell, a polycrystalline silicon solar cell, and an amorphous silicon solar cell according to a phase of a semiconductor.

Further, the solar cell is classified into a bulk (substrate) type solar cell and a thin film type solar cell according to a thickness of a semiconductor. The thin film type solar cell has a semiconductor layer with a thickness of less than several tens of μm or several μm. A single crystalline silicon solar cell and a polycrystalline silicon solar cell of the silicon system solar cell belong to a bulk type. An amorphous silicon solar cell belongs to a thin film type.

Meanwhile, the chemical compound solar cell is classified into a bulk type consisting of Group III-V Gallium Arsenide (GaAs) and Group III-V Indium Phosphide (InP), and a thin-film type consisting of Group II-VI Cadmium Telluride (CdTe) and Group I-III-VI Copper Indium Diselenide (CIS; CuInSe2). The organic material solar cell is largely divided into an organic molecule type and organic/inorganic combination type. Besides these a dye-sensitized solar cell belongs to a thin-film type.

Among various types of solar cells, a bulk type silicon solar cell having high energy conversion efficiency has been widely used for ground power units.

However, in recent years, in the increasing demand for a bulk type silicon solar cell, the cost thereof has rapidly increased due to lack of materials. Consequently, so as to develop cost reduction and mass production technology of a solar cell for large-scale ground power units, there is a significant need for the development of a thin-film solar cell capable of significantly reducing silicon materials consumption.

In general, a wet cleaning process using deionized water has been widely used in mass production of a thin film solar cell.

In mass production of a current solar cell, a soda lime glass or a low iron tempered glass on which a transparent electrode is formed, is used as a substrate. In this case, the transparent electrode is made of a low iron tempered glass, an indium tin oxide (ITO), or a tin oxide ($SnO_2$).

Further, a lightweight flexible substrate of low cost such as polyimide, polyethylen terephthalate (PET), PEN, aluminum (Al) foil, or stainless steel can be used.

When a substrate is contaminated with an organic material, a transparent electrode is readily peeled off from the substrate during formation of the solar cell, and the organic substances are diffused into an absorber layer, thereby reducing photoelectric conversion efficiency of the solar cell.

In addition, particles occurring during a unit process can be conveyed to other substrates through a conveyor or a robot in an in-line mass production line. During formation of the solar cell, particles can form pin holes. When conductive particles remain in a laser-patterning line, they may block insulation between adjacent unit cells to reduce yield and efficiency of a solar cell module.

Accordingly, so as to simultaneously achieve high efficiency and high yield in a mass production line of the solar cell, there is a need for multi-stage cleaning including initial cleaning, patterned transparent electrode cleaning, and cleaning after edge exclusion.

In this case, in the initial cleaning, a pure water cleaner using alkali detergent for cleaning is widely used to remove organic substances and particles formed on a surface of the substrate.

Moreover, in the patterned transparent electrode, when patterning a transparent electrode formed on a substrate by a laser scriber, a pure water cleaner is widely used to perform cleaning for removing particles formed on a surface of the substrate during patterning.

Subsequent to the transparent electrode cleaning, a substantial formation process of the solar cell is performed.

After a semiconductor layer is formed on a transparent electrode formed on the substrate, the resultant object is patterned in a laser patterning process. A metal electrode formed on the semiconductor layer is patterned, thereby constructing an internally serial-interconnected solar cell. Upon patterning the metal electrode, because conductive particles are produced, a cleaning process can be instantly performed by a pure water cleaner.

Next, after edge exclusion, a solar cell module is manufactured through works such as formation of a bus bar and assembling a module.

In this case, upon assembling a solar cell module, since an aluminum (Al) frame can be inserted, edge insulation is achieved. For the edge insulation, prior to formation of the bus bar, an edge exclusion process is carried out. The edge exclusion process removes semiconductor and conductive thin films formed or edge regions of the substrate to a predetermined width. In general, because a plurality of particles are produced during the edge exclusion process, after edge exclusion, cleaning is performed using a pure water clearer.

Although conventional pure water cleaners used in a mass production line of a thin film solar cell efficiently perform cleaning and remove particles, they have following disadvantages in terms of maintenance and management.

In general, because the pure water cleaner is composed of a unit sufficiently flowing pure water or detergent mixing water on a surface, a roll brush unit, a pure water rinsing unit, and an air knife unit removing moisture, a length of equipment is long to increase a total area of a mass production line of a solar cell.

Furthermore, since maintenance costs are increased and a large amount of waste water is generated in the production of a large amount of pure water and to manage resistance greater than a predetermined value, processing costs are high, which leads to an increase in total running costs.

SUMMARY

In one aspect, a manufacturing method of a thin film solar cell comprises performing dry cleaning of an insulation substrate on which a transparent electrode is formed, patterning the transparent electrodes to be spaced apart from each other, performing dry cleaning of the patterned transparent electrodes, forming a semiconductor layer on surfaces of the transparent electrodes and patterning a metal electrode on the semiconductor layer.

The step of performing the dry cleaning of the insulation substrate may include removing an organic material and removing particles.

Ozone may be used when the organic material is removed, and the ozone may be produced using one of atmosphere pressure plasma, a ultra-violet lamp, or a combination of the atmosphere pressure plasma and the ultra-violet lamp.

The step of removing the particles may include floating particles on the insulation substrate using cooling dried air and sucking the particles.

The step of performing the dry cleaning of the patterned transparent electrodes may include floating particles on the patterned transparent electrodes and sucking the floated particles in a circumference.

The manufacturing method may further comprise performing a dry cleaning of the patterned metal electrode.

The step of performing the dry cleaning of the patterned metal electrode may include floating particles on the metal electrode and sucking the floated particles.

The organic material may be removed by ozone after removal of the particles.

Nitrogen gas in plasma atmosphere may be used in the step of performing the dry cleaning of the patterned transparent electrode.

In other aspect, a manufacturing method of a thin film solar cell module comprises the steps of performing dry cleaning of an insulation transparent substrate on which a transparent electrode is formed, patterning the transparent electrodes to be spaced apart from each other, performing dry cleaning of the patterned transparent electrodes, forming a semiconductor layer (24) on surfaces of the transparent electrodes, patterning a metal electrode (26) on the semiconductor layer, performing an edge exclusion of removing the transparent electrodes, the semiconductor layer, and the metal electrode on edge regions of the insulation substrate to a predetermined width and performing a dry cleaning procedure after the edge exclusion step.

The step of dry cleaning the insulation substrate may include removing an organic material and removing particles.

Ozone may be used when the organic material is removed, and the ozone may be produced using one of atmosphere pressure plasma, a ultra-violet lamp, or a combination of the atmosphere pressure plasma and the ultra-violet lamp.

The step of removing the particles may include floating particles on the insulation substrate using cooling dried air and sucking the particles.

The dry cleaning step after the edge exclusion step may include floating particles on the patterned transparent electrodes and sucking the floated particles in a circumference.

The manufacturing method may further comprise performing dry cleaning of the patterned metal electrode.

The step of dry cleaning the patterned metal electrode may include floating particles on the metal electrode and sucking the floated particles.

DETAILED DESCRIPTION OF EMBODIMENTS

The present embodiment will be described in detail with reference to the accompanying drawings.

Figure 1:
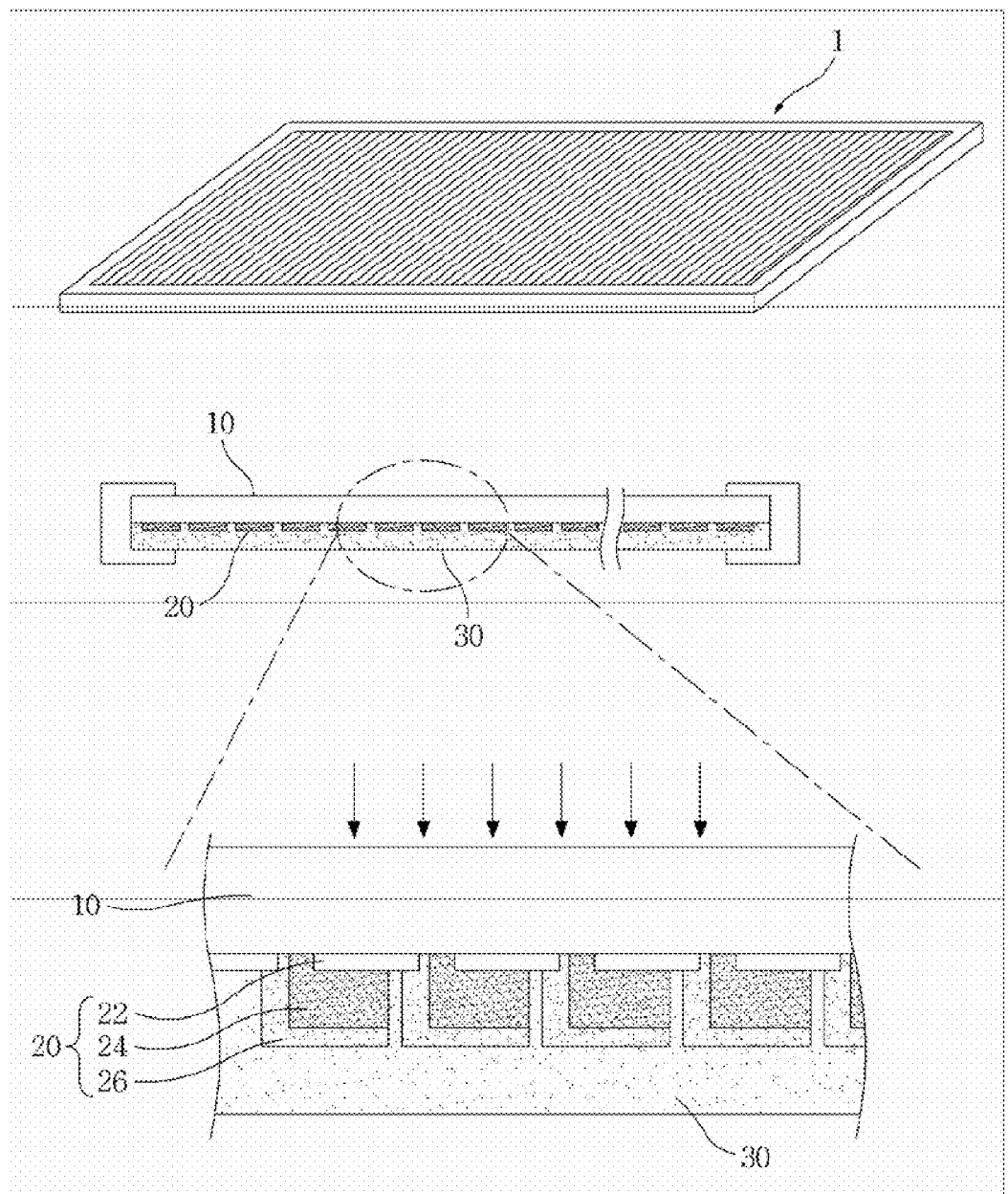
FIG. 1 is a cross-sectional view illustrating a structure of a thin film solar cell manufactured by manufacturing methods of a thin film solar cell and a thin film solar cell module in accordance with a first embodiment.

Referring to FIG. 1, a thin film solar cell 1 has a structure in which a plurality of unit cells 20 are electrically interconnected in series on a transparent substrate 10 such as a glass substrate or a transparent plastic substrate.

Accordingly, the thin film solar cell 1 includes band shaped transparent electrodes 22 on a transparent substrate 10 being an insulator to be insulated each other, a band shaped unit semiconductor layer 24 covering the transparent electrode 22, and a band shaped metal electrode layer 26 covering the semiconductor layer 24. A plurality of unit cells 20 are electrically interconnected in series on the transparent substrate 10.

So as to prevent electrical short-circuit of a solar cell and to protect the solar cell, a rear passivation layer 30 covers the metal electrode layer 26. In this case, the rear passivation layer 30 is made of resin.

In order to manufacture an integral thin film solar cell 1 having a structure described above, a laser patterning method, a chemical vaporization machining (CVM) method, or a mechanical scribing method by a metal probe has been generally used.

The laser patterning method etches the transparent electrode 22, the semiconductor layer 24, the metal electrode layer 26, and the like using YAG laser beam.

Referring to FIG. 1, the semiconductor layer 24 and the metal electrode layer 26 are sequentially deposited on the transparent electrode 22. The resultant object is covered by a rear passivation layer 30 to manufacture the thin film solar cell 1.

In a mass production line of the thin film solar cell 1, when the transparent substrate 10 is contaminated with an organic substance or particles are produced during a unit process, the yield and efficiency of a solar cell module can be deteriorated.

Accordingly, in the present embodiments, so as to simultaneously achieve high efficiency and high yield in a mass production line of a thin film solar cell, initial cleaning, patterned transparent electrode cleaning, patterned metal electrode cleaning, and cleaning after edge exclusion are performed in a dry cleaning.

The following is a detailed explanation of dry cleaning with reference to FIGS. 2 to 5.

Each of manufacturing methods of a thin film solar cell in accordance with the present embodiments include: patterning a transparent electrode 22 formed on an insulation transparent substrate 10 (S20), forming a semiconductor layer 24 on a surface of the transparent electrode 22 (S40), and patterning a metal electrode layer 26 on the semiconductor layer 24 (S50).

Figure 2:
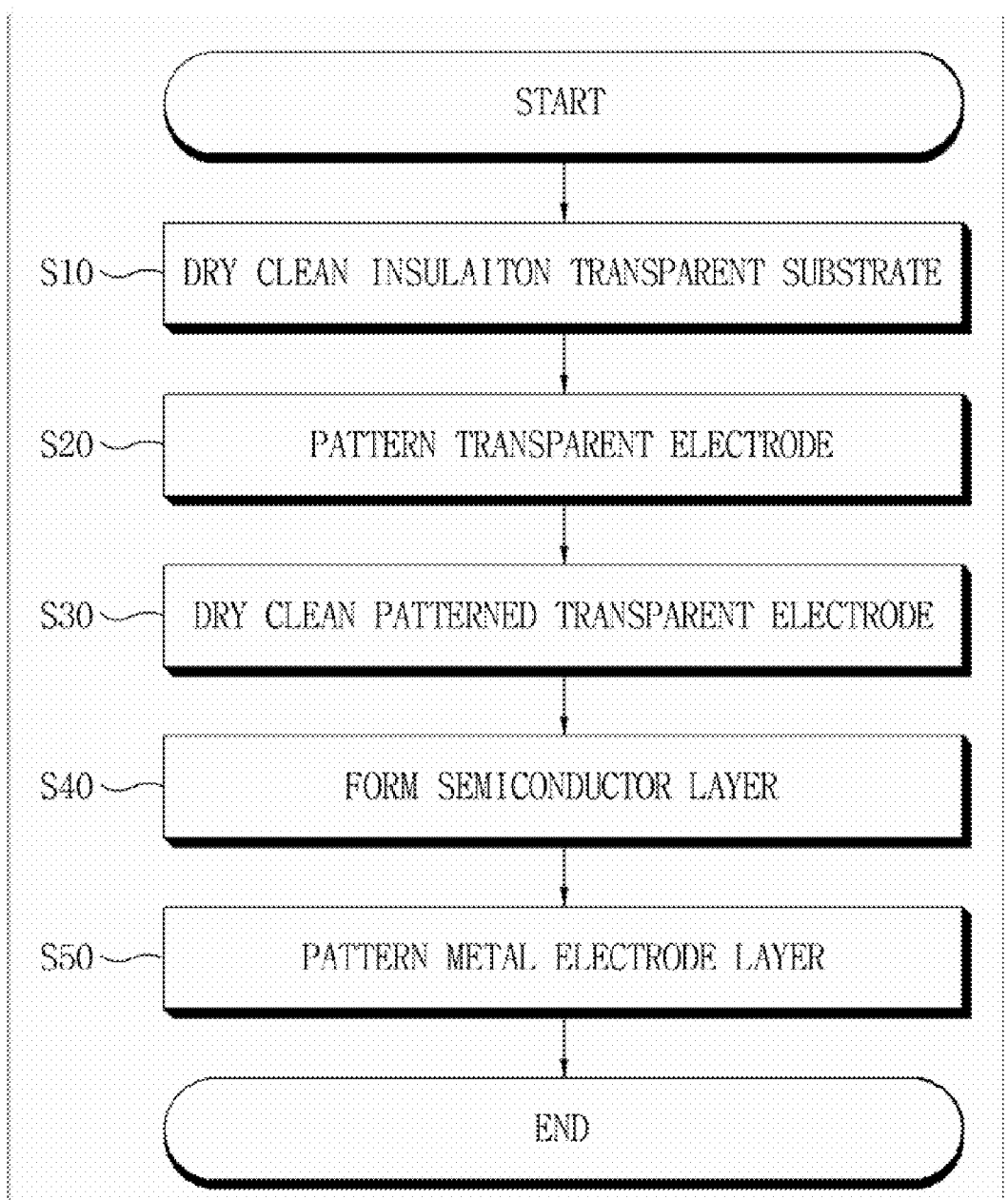
FIG. 2 is a flow chart illustrating a manufacturing method of a thin film solar cell in accordance with a second embodiment.

Referring to FIG. 2, a manufacturing method of a thin film solar cell in accordance with a second embodiment includes: performing a dry cleaning of the insulation transparent substrate 10 with nitrogen ($N_2$) of low purity and cooling dried air (CDA) before/the transparent electrode 20 is formed on the insulation transparent substrate 10 (S10); patterning the transparent electrode 22 (S20), and performing a dry cleaning of the patterned transparent electrode 22 (530) subsequent to step S20.

A cleaning method using one of atmosphere pressure plasma, Eximer Ultra-Violet (EUV), or an Ultra Sonic Cleaner (USC) may be used as the dry cleaning method.

In the atmosphere pressure plasma cleaning, nitrogen of low purity and CDA are used. The nitrogen of low purity has about 2N purity as plasma atmosphere gas. The CDA is reaction gas. An O radical is produced by plasma and reacts with oxygen ($O_2$) in atmosphere to produce ozone. The ozone reacts with an organic material to output CO and $CO_2$. The CO and $CO_2$ are discharged such that the organic material is removed.

Further, the cleaning method using the EUV produces ozone in atmosphere using an excimer laser as a ultra-violet light source. The ozone reacts with an organic material to produce volatile $CO/CO_2$, which is then discharged. Consequently, the organic material is removed.

In a cleaning method using USC, after CDA is filtered by passing through a hepa filter, a blow unit blows the CDA to the transparent substrate 10 with a constant time period (frequency). Accordingly, when an ultrasonic wave is generated and particles on the transparent substrate 10 float, a suction head sucks the floated particles with the result that a pre-filter collects the particles.

The organic material and the particles formed on a surface of the transparent substrate 10 can be removed by the foregoing dry cleaning methods. In order to do this, a dry cleaning system includes a unit removing the organic material by using nitrogen ($N_2$) of low purity and CDA, and a unit removing the particles by using CDA. Accordingly, in the manufacturing method of the present embodiment, the transparent substrate 10 is conveyed by driving a horizontal conveyor, and a procedure removing the organic material and a procedure removing the particles can be performed.

The unit removing the organic material removes the organic material using one of atmosphere pressure plasma, ultra-violet (UV) lamp, or a combination of the atmosphere pressure plasma and the ultra-violet (UV) lamp. The atmosphere pressure plasma and the ultra-violet (UV) lamp generates ozone in atmosphere to remove the organic material on a surface of the transparent substrate 10.

Further, a particle removal unit positioned at a rear portion can include a suction head blowing the particles on the transparent substrate 10 to suck the particles. There are electric energy, nitrogen of low purity, and CDA as necessary utilities, and a general exhaust process is required.

Meanwhile, a zinc oxide (ZnO) thin film is used as the transparent electrode 22, electron mobility of the zinc oxide (ZnO) thin film is increased by ozone processing to thereby reduce resistivity as an additional advantage.

Moreover, in a dry cleaning step (S30) of the transparent electrode 22, dry cleaning may be achieved through USC. Accordingly, after the transparent electrode 22 is patterned by a laser patterning device, generated particles are removed.

The transparent substrate 10 is conveyed by driving a horizontal conveyer, and particles on the transparent substrate 10 float through CDA. The suction head sucks to remove the particles. There are electric energy and CDA as necessary utilities, and general exhaustion is required.

In addition, when a zinc oxide thin film is used as the transparent electrode 22, electron mobility is increased by ozone processing to thereby reduce resistivity. Accordingly, an ultra-violet lamp can be installed at a rear part of the particle removal device. Consequently, after removal of the particles, the organic material can be removed by ozone. In this case, because generated ozone is detrimental to the human body, an ozone exhaust device can be provided. The ozone can be removed by the ozone exhaust device.

As a result, the organic material or the particles deposited on the insulation transparent substrate 10 or the transparent substrate 10 coated with the transparent electrode 22 are removed by dry cleaning, and the transparent electrode 22, the semiconductor layer 24, and the metal electrode layer 26 are sequentially deposited.

Figure 3:
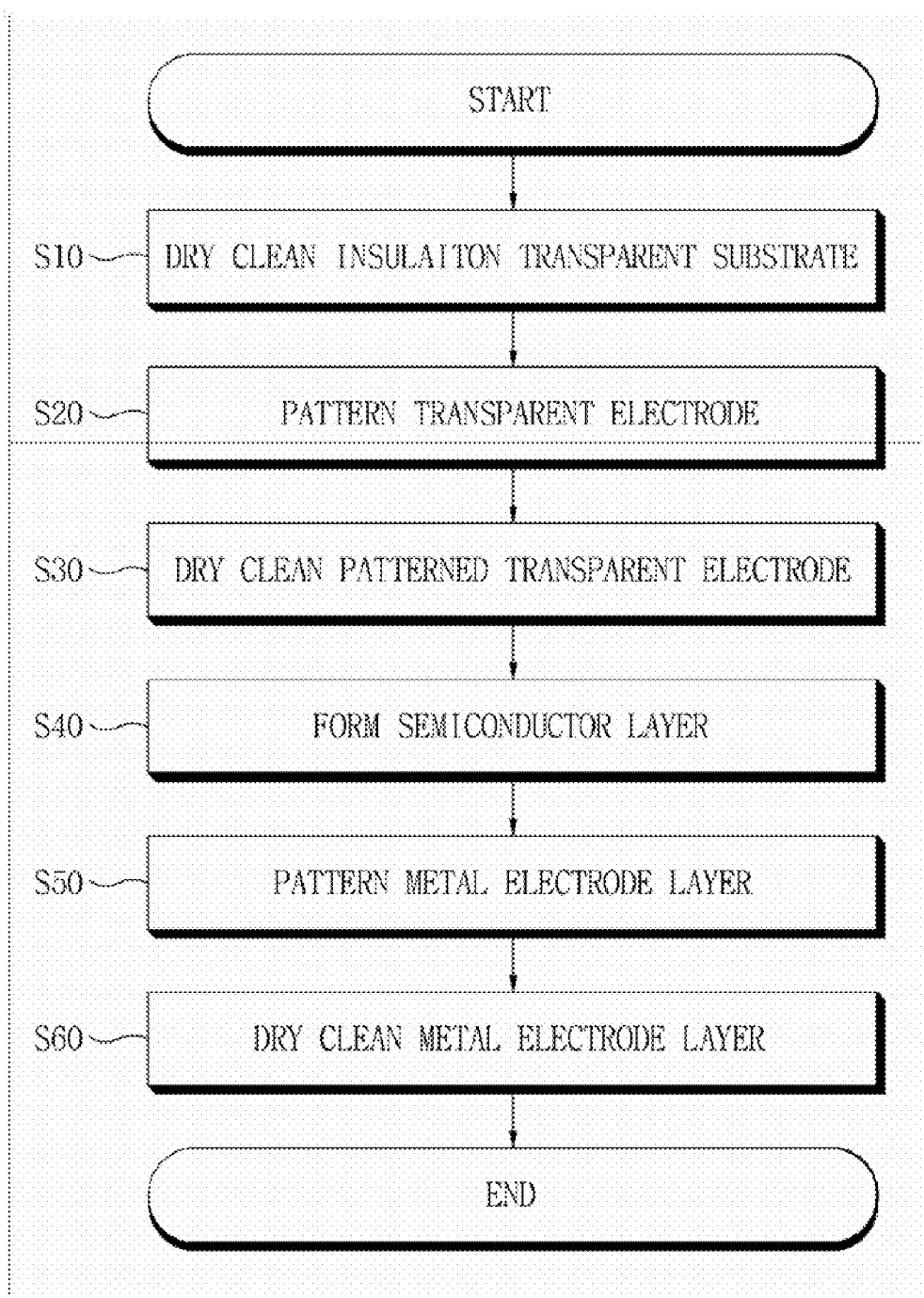
FIG. 3 is a flow chart illustrating a manufacturing method of a thin film solar cell in accordance with a third embodiment.

Referring to FIG. 3, a manufacturing method of a thin film solar cell in accordance with a third embodiment includes: performing a dry cleaning of the insulation transparent substrate 10 (S10) with nitrogen ($N_2$) of low purity and cooling dried air prior to patterning the transparent electrode 22 (S20), performing a dry cleaning of the patterned transparent electrode 22 with CDA subsequent to step S20 (S30), and performing a dry cleaning of a patterned metal electrode layer with CDA (S60) subsequent to a step of patterning the metal electrode layer 26 (S50).

Since steps S10 to S50 of the third embodiment were described in the second embodiment, an explanation thereof will be omitted.

In the third embodiment, a dry cleaning step S60 of the metal electrode layer 26 is performed to remove particles produced during pattern formation of the metal electrode layer after the pattern formation thereof. So as to remove the particles, the foregoing USC method can be used.

Meanwhile, the embodiment has been described that the manufacturing method of a thin film solar cell includes a dry cleaning step before or after patterning the transparent electrode 22 formed on the insulation transparent substrate 10. However, the manufacturing method of the present invention can further include dry cleaning step of a transparent substrate 10 on which a transparent electrode 22 is patterned.

Moreover, embodiments of a manufacturing method of a thin film solar cell module each include patterning transparent electrodes on an insulation transparent substrate 10 to be spaced apart from each other by a predetermined distance (S200), forming a semiconductor layer 24 on surfaces of the transparent electrodes 22 (S400), patterning a metal electrode layer 26 on the semiconductor layer 24 (S500), and removing parts of the transparent electrodes 22, the semiconductor layer 24, and the metal electrode layer 26 formed on edges of the transparent substrate 10 to a predetermined width (S600).

Figure 4:
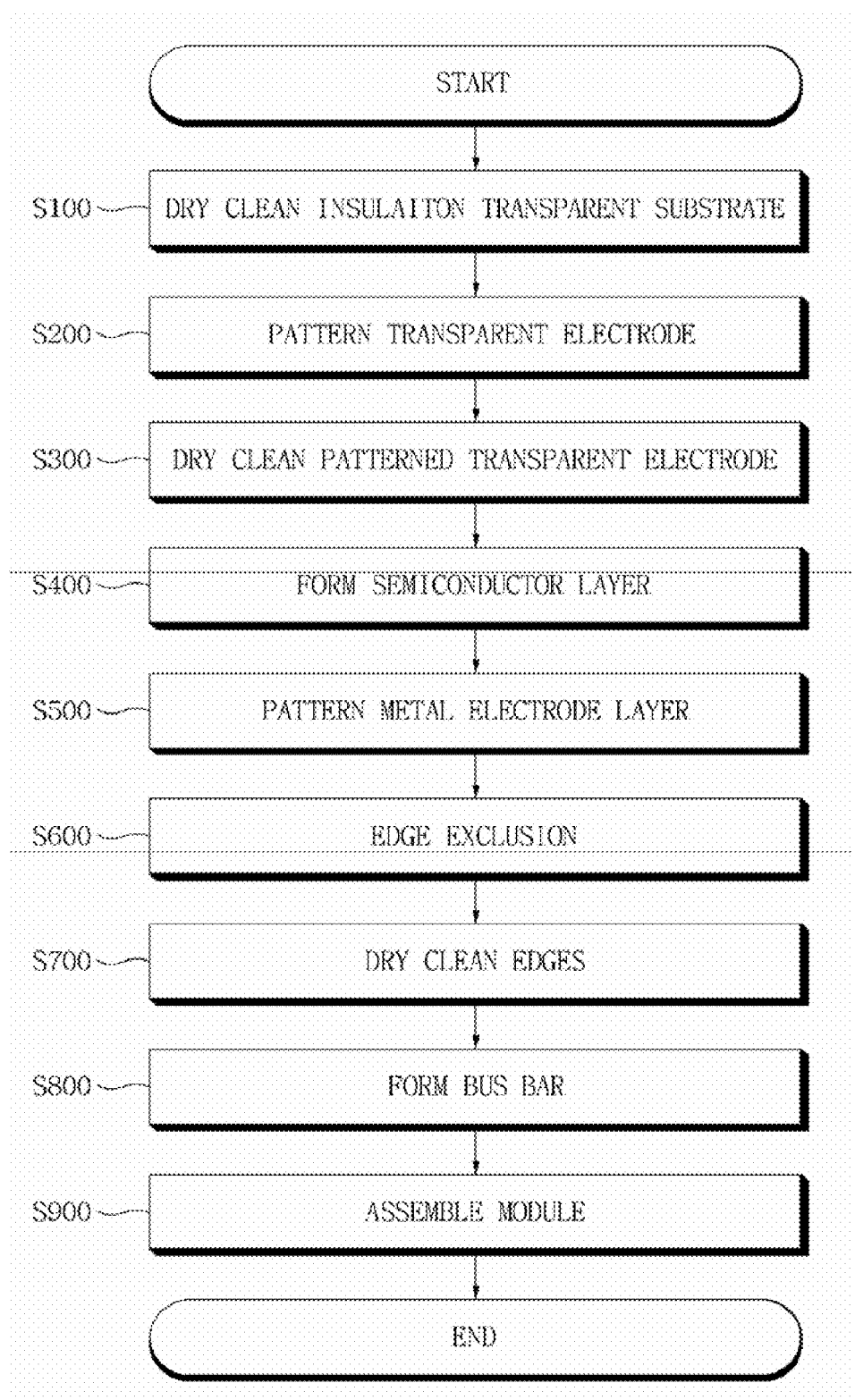
FIG. 4 is a flow chart illustrating a manufacturing method of a thin film solar cell module in accordance with a fourth embodiment.

Referring to FIG. 4, a manufacturing method of a thin film solar cell module in accordance with a fourth embodiment includes: performing a dry cleaning of an insulation transparent substrate 10 with nitrogen ($N_2$) of low purity and CDA (S100), patterning a transparent electrode 22 (S200), performing a dry cleaning of the patterned transparent electrode 22 with the CDA (S300), an edge exclusion step (S600), and performing a dry cleaning of edges with the CDA (S700).

Since steps S100, S200, and S300 of FIG. 4 are identical with steps S10, S20, and S30 of FIG. 2, a detailed description thereof will be omitted.

After a thin film solar cell is constructed in a method shown in FIGS. 1 and 2, edges of the thin film solar cell are excluded (S600), and a solar cell module is manufactured through a bus bar formation step (S800) and a module assembling step (S900).

Upon assembling the solar cell module, because an aluminum (Al) frame can be inserted into edges of a solar cell, there is a demand for insulation at the edges of the solar cell.

In order to insulate the edges, an edge exclusion step (S600) removing a semiconductor layer 24 and conductive thin films formed on edge parts of a transparent substrate 10 to a predetermined width is carried out prior to the bus bar formation (S800). A dry cleaning (S700) is performed to clean plural particles produced in the edge exclusion step (S600).

The transparent substrate 10 is conveyed by driving a horizontal conveyer, and CDA blows particles on the transparent substrate 10 by an USC method, then a suction head sucks the particles in the vicinity of the transparent substrate 10, thereby removing the particles. There are electric energy and CDA as necessary utilities, and a general exhaust process is required.

Figure 5:
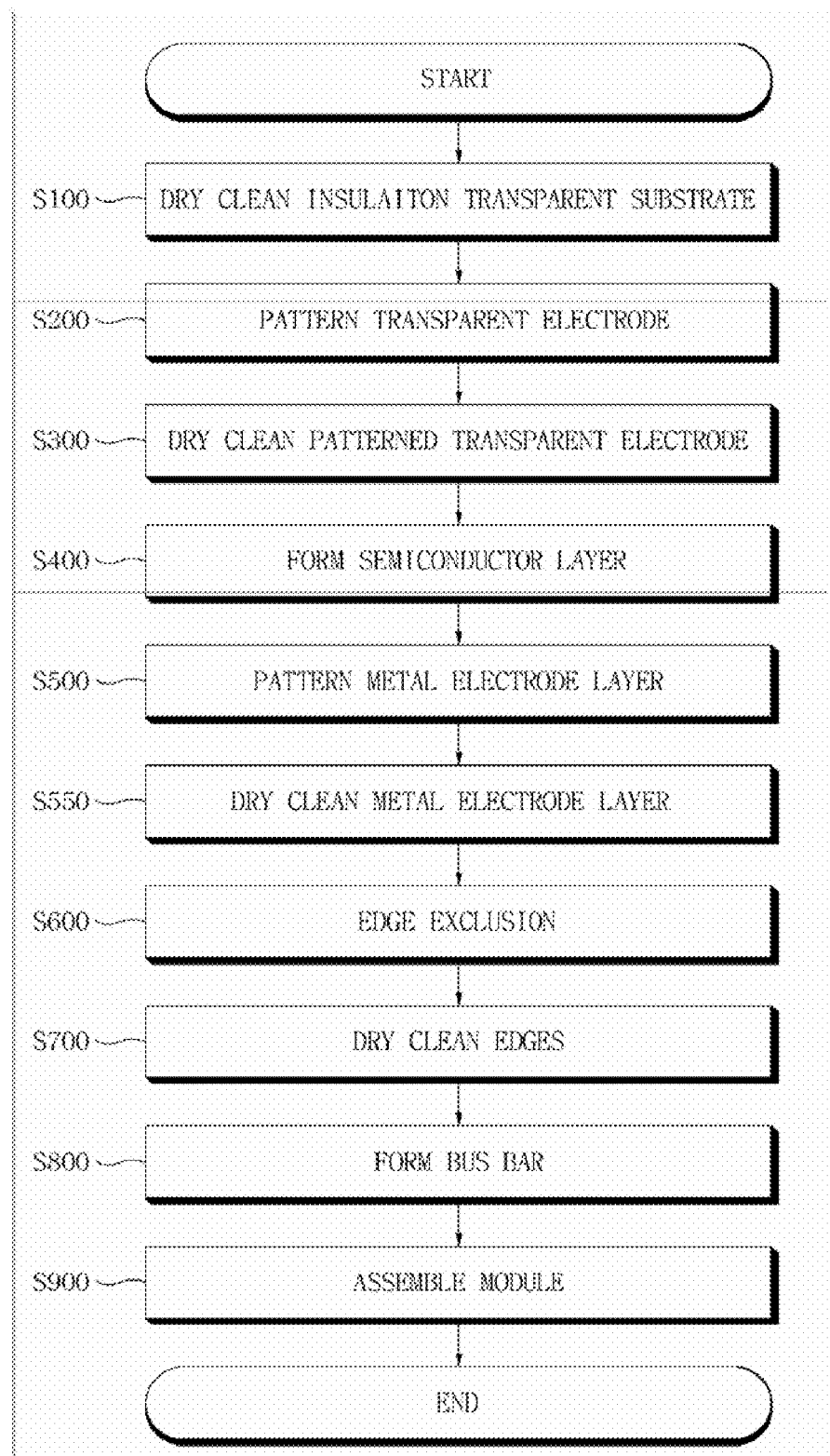
FIG. 5 is a flow chart illustrating a manufacturing method of a thin film solar cell module in accordance with a fifth embodiment.

Referring to FIG. 5, a manufacturing method of a thin film solar cell module in accordance with a fifth embodiment includes: performing a dry cleaning of an insulation transparent substrate 10 with nitrogen ($N_7$) of low purity and CDA (S100), patterning the transparent electrode 22 (S200), performing a dry cleaning of the patterned transparent electrode 22 with CDA (S300), patterning a metal electrode layer 26 (S500), performing a dry cleaning of the patterned metal electrode layer 26 with CDA (S550), an edge exclusion step (S600), and dry cleaning edges with CDA (S700).

Manufacturing methods of a thin film solar cell and a thin film solar cell module in accordance with the present embodiments perform dry cleaning using a dry cleaning unit in place of a pure water cleaner. Namely, because the length of the pure water cleaner is long, an occupied area of the pure water cleaner is relatively large in a total solar cell mass production line. Further, in a case of the pure water cleaner, maintenance costs are increased and a large amount of waste water is generated in the production of a large amount of pure water and to manage resistance greater than a predetermined value. In contrast, in a case of a dry cleaning unit, initial manufacturing costs and running costs may be reduced in a thin film solar cell and module mass production line.

The foregoing embodiments and advantages are merely exemplary and are not to be construed as limiting the present invention. The present teaching can be readily applied to other types of apparatuses. The description of the foregoing embodiments is intended to be illustrative, and not to limit the scope of the claims. Many alternatives, modifications, and variations will be apparent to those skilled in the art.

What is claim is:

1. A manufacturing method of a thin film solar cell comprising the steps of:
    performing dry cleaning of an insulation substrate on which a transparent electrode is formed;
    patterning the transparent electrodes to be spaced apart from each other;
    performing dry cleaning of the patterned transparent electrodes;
    forming a semiconductor layer on surfaces of the transparent electrodes; and
    patterning a metal electrode on the semiconductor layer.

2. The manufacturing method according to claim 1, wherein the step of performing the dry cleaning of the insulation substrate includes:
    removing an organic material; and
    removing particles.

3. The manufacturing method according to claim 2, wherein ozone is used when the organic material is removed, and the ozone is produced using one of atmosphere pressure plasma, a ultra-violet lamp, or a combination of the atmosphere pressure plasma and the ultra-violet lamp.

4. The manufacturing method according to claim 2, wherein the step of removing the particles includes:
    floating particles on the insulation substrate using cooling dried air; and
    sucking the particles.

5. The manufacturing method according to claim 2, wherein the step of performing the dry cleaning of the patterned transparent electrodes includes:
    floating particles on the patterned transparent electrodes; and
    sucking the floated particles in a circumference.

6. The manufacturing method according to claim 1, further comprising performing a dry cleaning of the patterned metal electrode.

7. The manufacturing method according to claim 6, wherein the step of performing the dry cleaning of the patterned metal electrode includes:
    floating particles on the metal electrode; and
    sucking the floated particles.

8. The manufacturing method according to claim 2, wherein the organic material is removed by ozone after removal of the particles.

9. The manufacturing method according to claim 1, wherein nitrogen gas in plasma atmosphere is used in the step of performing the dry cleaning of the patterned transparent electrode.

10. A manufacturing method of a thin film solar cell module comprising the steps of:
    performing dry cleaning of an insulation transparent substrate on which a transparent electrode is formed;
    patterning the transparent electrodes to be spaced apart from each other;
    performing dry cleaning of the patterned transparent electrodes;
    forming a semiconductor layer on surfaces of the transparent electrodes;
    patterning a metal electrode on the semiconductor layer;
    performing an edge exclusion of removing the transparent electrodes, the semiconductor layer, and the metal electrode on edge regions of the insulation substrate to a predetermined width; and
    performing a dry cleaning procedure after the edge exclusion step.

11. The manufacturing method according to claim 10, wherein the step of dry cleaning the insulation substrate includes:
    removing an organic material; and
    removing particles.

12. The manufacturing method according to claim 11, wherein ozone is used when the organic material is removed, and the ozone is produced using one of atmosphere pressure plasma, a ultra-violet lamp, or a combination of the atmosphere pressure plasma and the ultra-violet lamp.

13. The manufacturing method according to claim 11, wherein the step of removing the particles includes:
    floating particles on the insulation substrate using cooling dried air; and
    sucking the particles.

14. The manufacturing method according to claim 11, wherein the dry cleaning step after the edge exclusion step includes:
    floating particles on the patterned transparent electrodes; and
    sucking the floated particles in a circumference.

15. The manufacturing method according to claim 10, further comprising performing dry cleaning of the patterned metal electrode.

16. The manufacturing method according to claim 15, wherein the step of dry cleaning the patterned metal electrode includes:
    floating particles on the metal electrode; and
    sucking the floated particles.

* * * * *